United States Patent [19]

Schoenborn et al.

[11] Patent Number: 5,902,704
[45] Date of Patent: May 11, 1999

[54] PROCESS FOR FORMING PHOTORESIST MASK OVER INTEGRATED CIRCUIT STRUCTURES WITH CRITICAL DIMENSION CONTROL

[75] Inventors: Philippe Schoenborn, San Jose; John Haywood, Santa Clara, both of Calif.

[73] Assignee: LSI Logic Corporation

[21] Appl. No.: 08/887,910

[22] Filed: Jul. 2, 1997

[51] Int. Cl.$^6$ .................................. G03F 9/00; G03C 5/00
[52] U.S. Cl. ...................................................... 430/5; 430/30
[58] Field of Search ................................. 430/5, 30, 313, 430/316

Primary Examiner—Christopher G. Young
Attorney, Agent, or Firm—John P. Taylor

[57] ABSTRACT

A process for forming a photoresist mask over a patternable layer of an integrated circuit structure formed on a semiconductor substrate is described wherein the photoresist mask is initially formed with oversized lateral dimensions over a layer of patternable material of an integrated circuit on a semiconductor substrate. The oversized resist mask is then optionally measured in a vacuum apparatus to determine the size of the critical dimensions; then dry etched, preferably in the same vacuum apparatus, to reduce the size of the resist mask; then measured to determine the size of the critical dimensions (preferably again in the same vacuum apparatus); and then, if necessary, further dry etched to further reduce the size of the critical dimensions. The dry etching and subsequent measurement steps are repeated until the desired critical dimensions of the resist mask are reached. If the dry etching step should accidentally overetch the resist pattern, the structure can still be reworked by removing the resist mask and applying a fresh resist layer as in the prior art. After the correctly sized resist mask has been formed and determined by the cycle of dry etch and measurement steps, the underlying patternable layer can be etched through the photoresist mask, with a greatly reduced chance that the etched pattern in the underlying layer will have unsatisfactory dimensions.

13 Claims, 4 Drawing Sheets

PROCESS FOR FORMING PHOTORESIST MASK OVER INTEGRATED CIRCUIT STRUCTURES WITH CRITICAL DIMENSION CONTROL

BACKGROUND OF THE INVENTION

1. Field of the Invention

This invention relates to the formation of integrated circuit structures. More particularly this invention relates to a process for accurately forming narrow dimension structures such as metal lines or gate electrodes of integrated circuit structures on semiconductor substrates.

2. Description of the Related Art

In the accurate formation of fine dimension structures such as, for example, 0.25 micrometer ($\mu$m) wide gate electrodes or metal lines in a layer of patternable material, forming a portion of an integrated circuit structure on a semiconductor substrate, a layer of photoresist is first formed over the layer to be etched. The photoresist layer is then exposed to a light pattern through a reticle (light mask). Using a positive mask system, the light exposes those portions of the photoresist layer to be removed. When the exposed photoresist layer is then developed to remove the light-exposed photoresist, a pattern of photoresist (photoresist mask) remains conforming to the desired pattern to be formed in the underlying layer of patternable material, using the photoresist mask as an etch mask.

Conventionally before etching the underlying patternable layer (such as a polysilicon or metal layer) through the resulting photoresist mask, the dimensions of the resulting resist mask are measured to determine the accuracy of the resist mask, since this will determine the accuracy of the desired dimensions in the patternable layer of material to be etched. When the mask is measured and any dimensions are found to be out of specifications, particularly critical dimensions such as the width of the gate electrode or of the metal line, the structure must be reworked by removing the remaining portions of the resist mask, and then starting over again with a fresh layer of photoresist from which a new photoresist etch mask will be formed.

Typically the photoresist mask formation is carried out in a different chamber or apparatus than the apparatus used to measure the critical dimensions of the resulting photoresist mask, so it is not unusual for the measurement step to be carried out on a sampling basis. However, if the critical mask dimensions are not within specifications, e.g., if the mask dimensions on a substrate not measured are incorrect, the subsequent etch pattern etched into the underlying patternable layer, e.g., an underlying polysilicon or metal layer, will also be wrong, resulting in the need to either remove the underlying patterned layer (when possible) or to discard the entire wafer.

It would, therefore, be desirable to provide a process wherein more accurate control of the critical dimensions of resist masks can be maintained and the need for the reworking of resist masks formed out of specification can be either reduced or eliminated. It is further desirable that such a process be carried out on all substrates (rather than only on random samples) to eliminate the problem of underlying patternable layers etched to unacceptable dimensions.

SUMMARY OF THE INVENTION

In accordance with the process of the invention, a photoresist mask is initially formed with oversized lateral dimensions over a layer of patternable material of an integrated circuit on a semiconductor substrate. The oversized resist mask is optionally measured initially in a vacuum apparatus to determine the size of the critical dimensions; then dry etched, preferably in the same vacuum apparatus (but not necessarily in the same vacuum chamber), to reduce the size of the resist mask; and then measured to determine the size of the critical dimensions of the resist mask (preferably again in the same vacuum apparatus). Then, if necessary, the resist mask is further dry etched to further reduce the size of the critical dimensions; with the dry etching and subsequent measurement steps repeated until the desired critical dimensions of the resist mask are reached. If the dry etching step should accidentally overetch the resist mask, the structure can still be reworked by removing the resist mask and applying a fresh resist layer as in the prior art. After the correctly sized resist mask has been formed and determined by the cycle of dry etch and measurement steps, the underlying patternable layer can be etched through the photoresist mask, with a greatly reduced chance that the etched pattern in the underlying layer will have unsatisfactory dimensions.

DETAILED DESCRIPTION OF THE INVENTION

Figure 2:
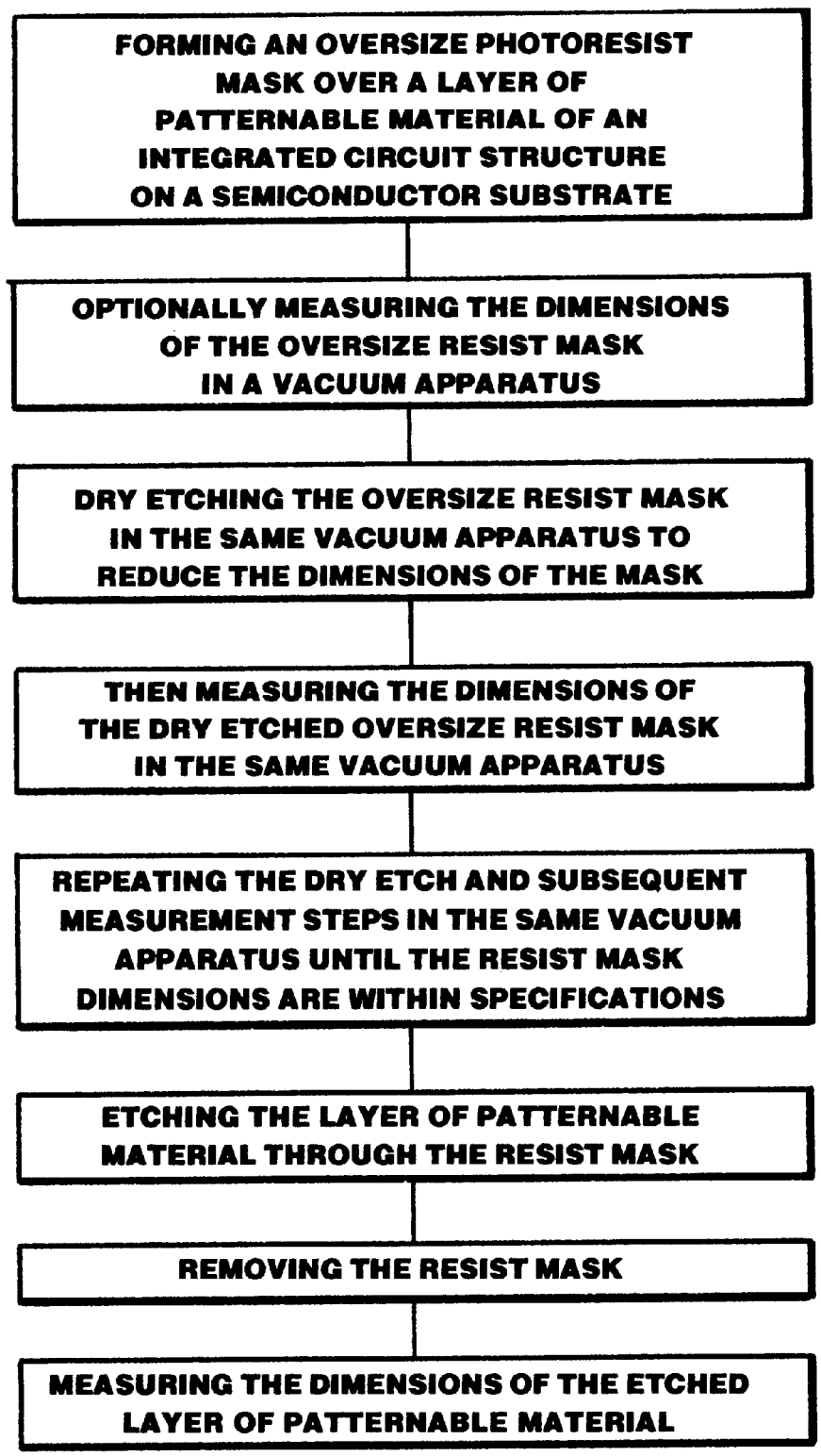
FIG. 2 is a flowsheet illustrating the process of the invention.

In accordance with the process of the invention, as shown in the flowsheet of FIG. 2, an oversized photoresist mask is first formed over a patternable layer of material to be etched, such as, for example, a polysilicon or a metal layer, of an integrated circuit structure on a semiconductor substrate. The critical dimensions of the oversized resist mask may be optionally measured at this time to determine more accurately how much of the resist mask will need to be removed to reach the desired dimensions. In any event, the resist mask is then subjected to a first dry etch step to reduce the size of the resist pattern, hopefully down to the desired critical dimensions.

After the first dry etch step, the resist mask is measured. If the resist mask is still oversized, a second dry etch step is performed, followed by a further measurement. If the dimensions of the resist mask are found to be within specifications after the first dry etch step, normal processing of the structure resumes, i.e., the underlying layer is conventionally patterned (etched) through the resist mask, and the resist mask is then removed.

If, however, after the first dry etch step, the resist mask is measured and found to be undersized, the remaining resist mask material may be removed (stripped off the integrated circuit structure). A fresh resist mask layer may then be applied to the integrated circuit structure, patterned through a reticle, and then developed (to remove the exposed resist) to again form an oversized resist mask, with the previously described processing steps again applied to the resist mask.

The initial oversized resist mask may be formed in the resist layer by appropriate adjustment of the optics, i.e., the light pattern, to which the photoresist layer is initially exposed, followed by the conventional wet development of the exposed portions of the resist layer (for positive resist) or development of the unexposed resist (for negative resist).

The substrate (with the integrated circuit structure thereon, and the oversized resist mask formed over the integrated circuit structure) is then placed in a vacuum apparatus. The substrate may be optionally inserted first into a measurement-chamber of the vacuum apparatus and measured, for example, with a scanning electron microscope (SEM), to more accurately determine the amount of resist which needs to be removed by the subsequent dry etch step. Other measurement techniques which may also be used in a vacuum chamber to determine the lateral dimensions of the resist mask include Atomic Force Microscopy (AFM) or electrical measurement of line resistance.

Alternatively, the substrate may be inserted first into a plasma etch chamber of the vacuum apparatus and initially subjected to a first dry etch step prior to the first measurement. This latter procedure may be preferred if the approximate dimensions of the oversized mask are known from prior formations, and the duration or extent of the first dry etch step has previously been empirically determined from such prior procedures, so as to avoid an overetch of the resist mask during the first plasma etch of the oversized resist mask.

In any event, after the initial dry etch of the oversized resist mask, the substrate is moved to a measurement chamber, preferably within the same vacuum apparatus used for the dry etching step, to measure the lateral dimensions of the plasma etched resist mask to determine whether or not any further etching will be necessary (i.e., if the resist mask is still oversized), or whether the resist mask dimensions are now within the desired specifications, in which case the substrate will be transferred to an etch chamber wherein conventional processing of the substrate will resume by the patterning of the underlying layer using the resist mask.

If, however, the measurement of the etched resist mask after the dry etch step shows that the resist mask is undersized, i.e., overetched, the entire resist mask may be removed from the integrated circuit structure, and the substrate sent back for reworking, i.e., formation of a new or second oversized resist mask.

It should be noted at this point, that in a preferred practice of the process of the invention, the dry etching step is preferably carried out in a manner which will attempt to underetch, rather than overetch, the resist mask, since the worst that can happen if the resist mask is found, by a subsequent measurement, to be underetched, is that a further dry etch step may need to be carried out, whereas overetching of the resist mask will result in the need for stripping of the undersized resist mask from the substrate followed by reworking of the structure to form another resist mask.

It should also be noted that while reworking of the substrate may be carried out if the critical resist mask dimension or dimensions are too small, such reworking is to be avoided if possible, since such reworking may require a higher level of selectively to the underlying polysilicon/metal/metal compound layer because the dry etching step carried out with respect to the first oversized mask will need to be repeated with the second (reworked) oversize resist mask as well. That is, the underlying layer will be subject to a further series of one or more dry etching steps to bring the lateral dimensions of the oversize rework resist mask down to acceptable dimensions and the surface of the underlying layer of patternable material will, therefore, be subject to the resist etch twice. In this regard, it must be further observed that reworking is also to be avoided, if possible, because of the possibility of misregistration of multiple lithographic exposures and the attendant problems which would arise from such misregistration during processing of the second resist mask. Thus, it is preferable, that the process is carried out to underetch, rather than overetch, the initial resist mask, using the drying etching processing of the invention.

By initially forming an oversized mask and then drying etching the mask to reduce the size, the probability of having to rework the underlying integrated circuit structure due to formation of an undersized resist mask is reduced. Furthermore, by preferably carrying out both the dry etching of the oversized resist mask and the measurement of the resist mask dimensions in the same vacuum apparatus, all of the substrates can be measured (rather than a random sampling as in the prior art), without consuming large amounts of process time during movement of the substrate from a measurement chamber in one apparatus to an etching chamber in another apparatus and back. As a result, the chance of etching an undersized pattern of metal lines, gate electrodes, etc. in the underlying layer of patternable material through such an undersized resist mask can be reduced or preferably eliminated.

Thus, it will be noted that both the plasma etch step (or steps) and the measurement step (or steps) have been referred to as being preferably carried out, in accordance with the invention, in the same vacuum apparatus. Not only does this speed the process of dry etching and measuring the resist mask being formed, but as mentioned above, it is conducive to 100% processing (rather than random sampling) of the resist dimensions, thus significantly lowering the chance of forming an undersized resist mask, as well as lowering the concomitant chance of etching an undersize pattern of lines, gate electrodes, etc. through such an undersized resist mask.

The dry etching step used to reduce the lateral dimensions of the oversized resist mask, may be carried out using an oxygen-containing plasma such as, for example, an $O_2$ plasma or an $O_2/N_2$ plasma, or any other plasma capable of selectively removing (ashing) resist without materially etching the underlying material such as, for example: polysilicon (for formation of gate electrodes); or metals such as aluminum, titanium, tungsten; or metal compounds such as titanium nitride (for formation of patterns of metal lines).

It should be noted that while the purpose of the invention to provide for a more accurate processing of an otherwise attainable given size, e.g., the width of a metal line or gate electrode, the invention could be used to form a resist size unattainable accurately by conventional processing. That is a very small linewidth of a resist pattern could be made accurately in accordance with the invention, where the same linewidth might not be attainable with any accuracy using conventional lithographic processing.

Figure 1:
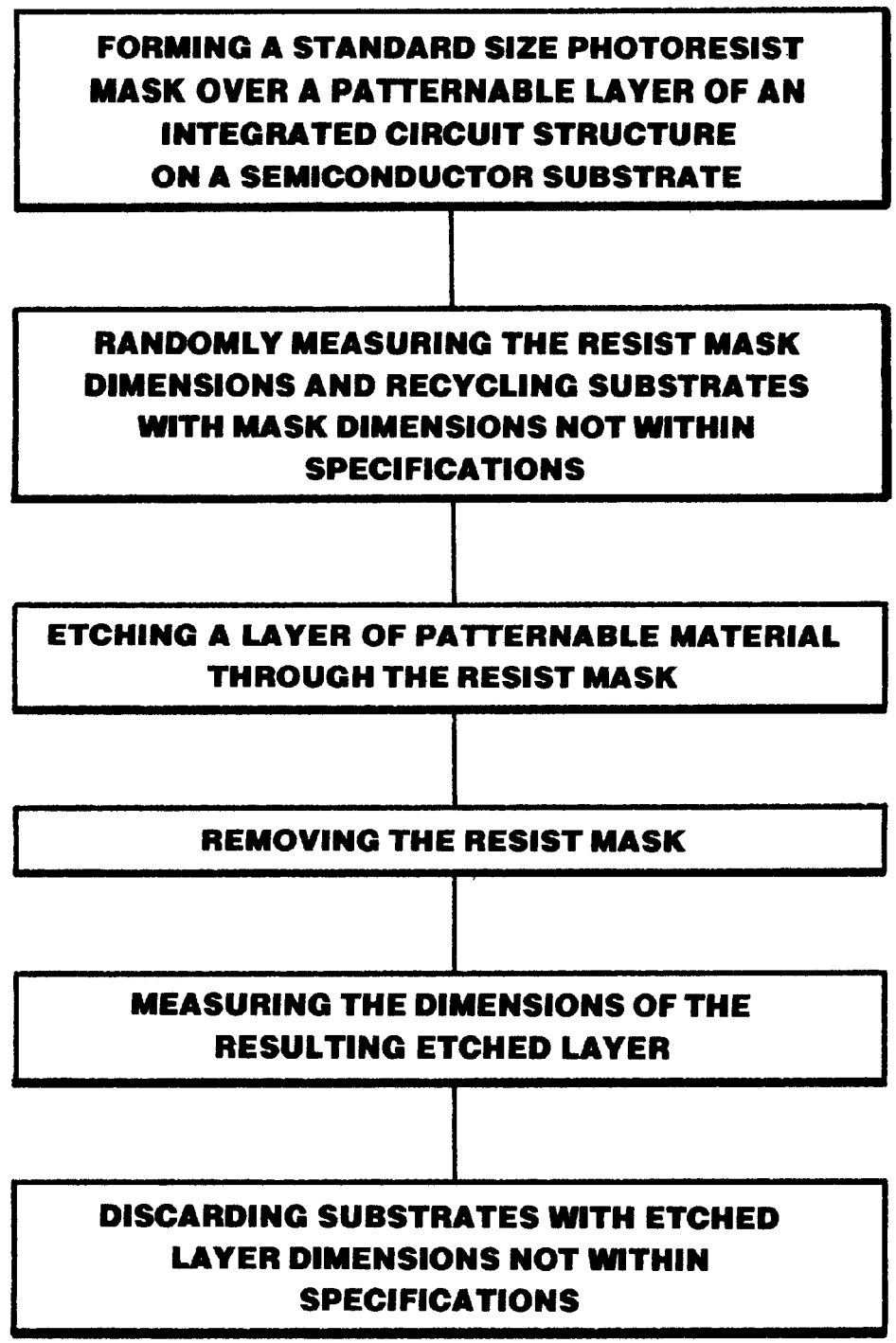
FIG. 1 is a flowsheet illustrating the process of the prior art.

Referring to the Figures, as previously alluded to, FIG. 2 illustrates, in flowsheet form, the process of the invention in contrast to the prior art process shown in FIG. 1. However, it will be further noted that FIG. 2, in addition to containing the steps of the invention of forming an oversized resist mask and of dry etching this oversize resist mask, also omits the last step of the prior art process shown in FIG. 1. That is FIG. 2 omits the step in FIG. 1 of discarding the substrate after the layer of etched material has been etched and the etched material then measured and found to be outside of specifications. This omission is deliberate because the practice of the invention should eliminate the need for discarding substrates with the dimensions of the etched material not within specifications when the resist mask dimensions are not within specifications, since the practice of the process of the invention should ensure that the resist mask dimensions will be within specifications.

Figure 3:
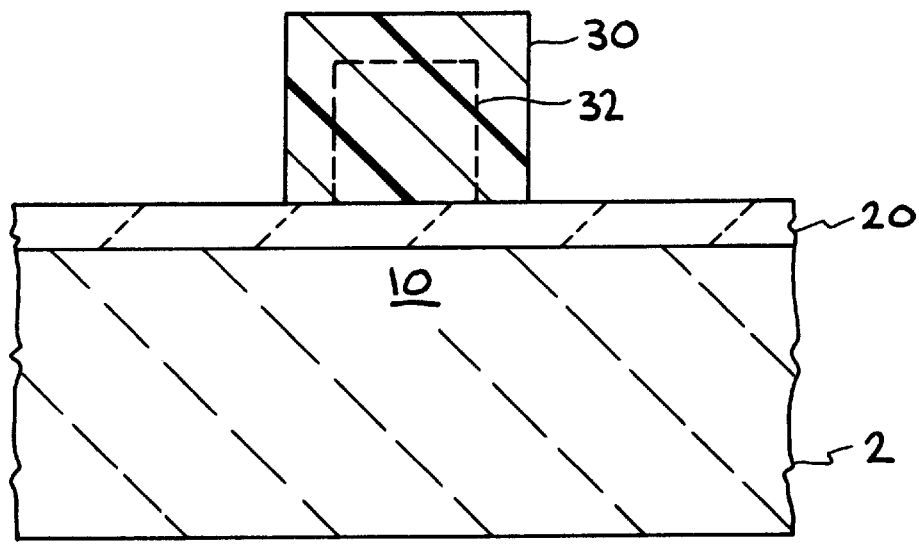
FIG. 3 is a fragmentary vertical cross-section view of an oversized photoresist mask formed, in accordance with the invention, over an underlying patternable layer of an integrated circuit to be patterned by etching through the resist mask.

As shown in FIG. 3, a substrate 2 has portions of an integrated circuit structure 10 previously formed thereon including a patternable upper layer 20, such as a polysilicon layer or one or more metal/metal compound layers. In accordance with the invention, an oversized photoresist mask 30 is first formed over patternable layer 20, with dotted lines 32 illustrating the desired final lateral dimensions of initially oversized resist mask 30.

By "oversized" is meant that at least the lateral (length and width) dimensions of resist mask 30 exceed the lateral dimensions of the pattern to be etched in underlying patternable layer 20. It should be noted, in this regard, that since resist mask 30 will be subject to a plasma etch to reduce the lateral dimensions of resist mask 30, there will also be a thinning of the thickness of resist mask 30. Therefore, preferably, the initial thickness of resist mask 30 will also be oversized as well so that the subsequent plasma etching of resist mask 30 does not unduly thin resist mask 30 so as to interfere with the subsequent usage of resist mask 30 for the patterning of underlying layer 20.

While the exact amount of the oversizing of resist mask 30 is not critical, the minimum amount of oversizing should be sufficient to permit the desired plasma etching of the oversized resist mask down to the desired dimensions without overetching the resist mask. With respect to the maximum amount of oversizing of resist mask 30, this will be influenced by the selectivity of the etching system, as well as the initial thickness of the resist layer. If the thickness of the resist mask is not sufficient, prolonged etching of the resist layer to reduce the lateral dimensions of an extensively oversized resist mask may unduly thin the resulting resist mask, while a low selectivity coupled with an excessively oversized mask may result in removal of too much of the underlying patternable layer. In any event, it is undesirable to lengthen the processing time by extending the plasma etch time to remove excessive amounts of photoresist, if such resist mask thicknesses are not necessary to accomplish the goal of the invention, i.e., to provide a more accurately sized resist mask. Typically, the oversizing of the resist mask will vary from a minimum of about 1% to a maximum of about 100%, and preferably from about 10% to about 100%, over the desired final dimensions of the resist mask.

Figure 4:
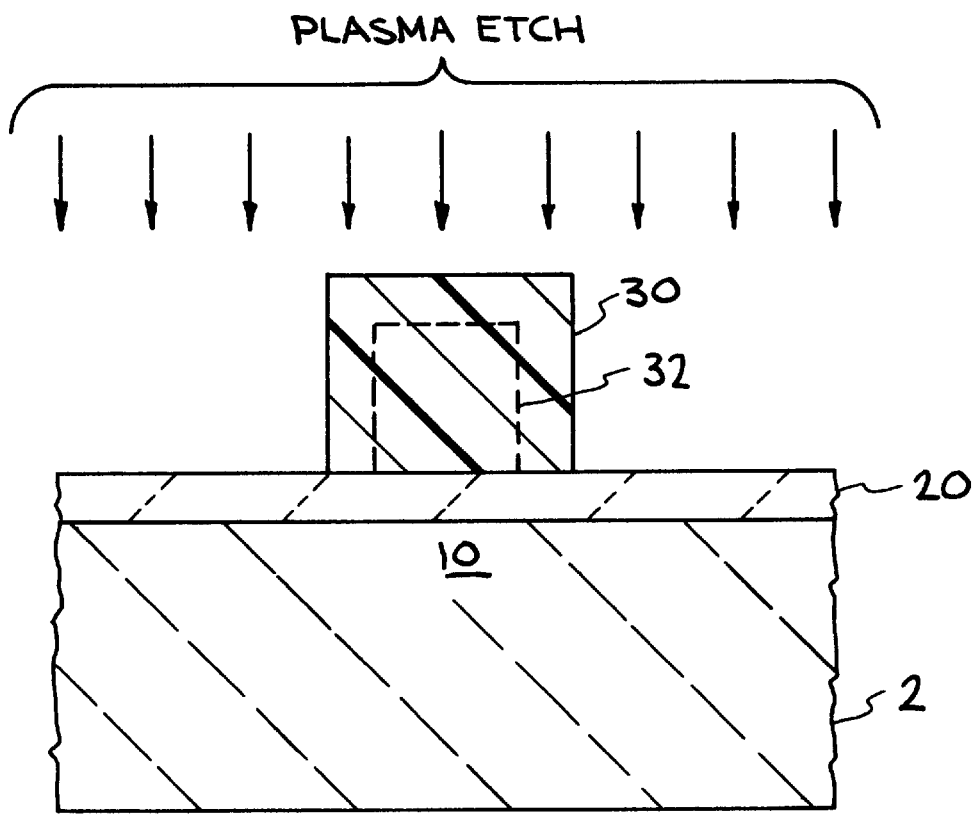
FIG. 4 is a fragmentary vertical cross-section view of the oversized photoresist mask of FIG. 3 being subject to a dry etch, in accordance with the invention, to reduce the mask dimensions down to the desired size.
Figure 5:
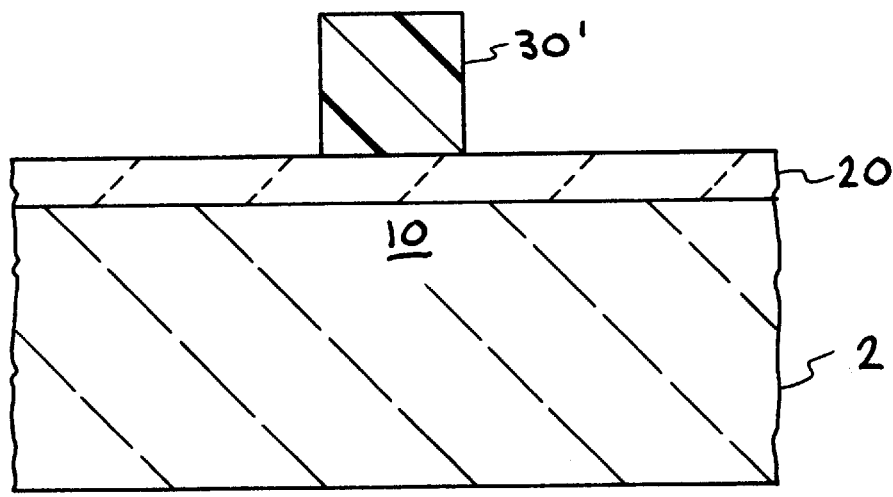
FIG. 5 is a fragmentary vertical cross-section view of the photoresist mask of FIGS. 3 and 4, after the photoresist mask lateral dimensions have been reduced by dry etching down to the desired size in accordance with the invention.

Referring now to FIG. 4, oversized mask 30 is shown being subjected to plasma (dry) etching, in accordance with the invention, to remove those portions of resist mask 30 outside of dotted lines 32. After the initial dry etching step, resist mask 30 is measured and if the lateral dimensions are now within specifications, the resist mask preparation is complete and the resulting resist mask 30', as shown in FIG. 5, is ready for patterning of underlying patternable layer 20. That is, oversize resist mask 30, after dry etching to within specifications for the lateral dimensions of the resist mask, is now depicted as resist mask 30' in FIG. 5.

Figure 6:
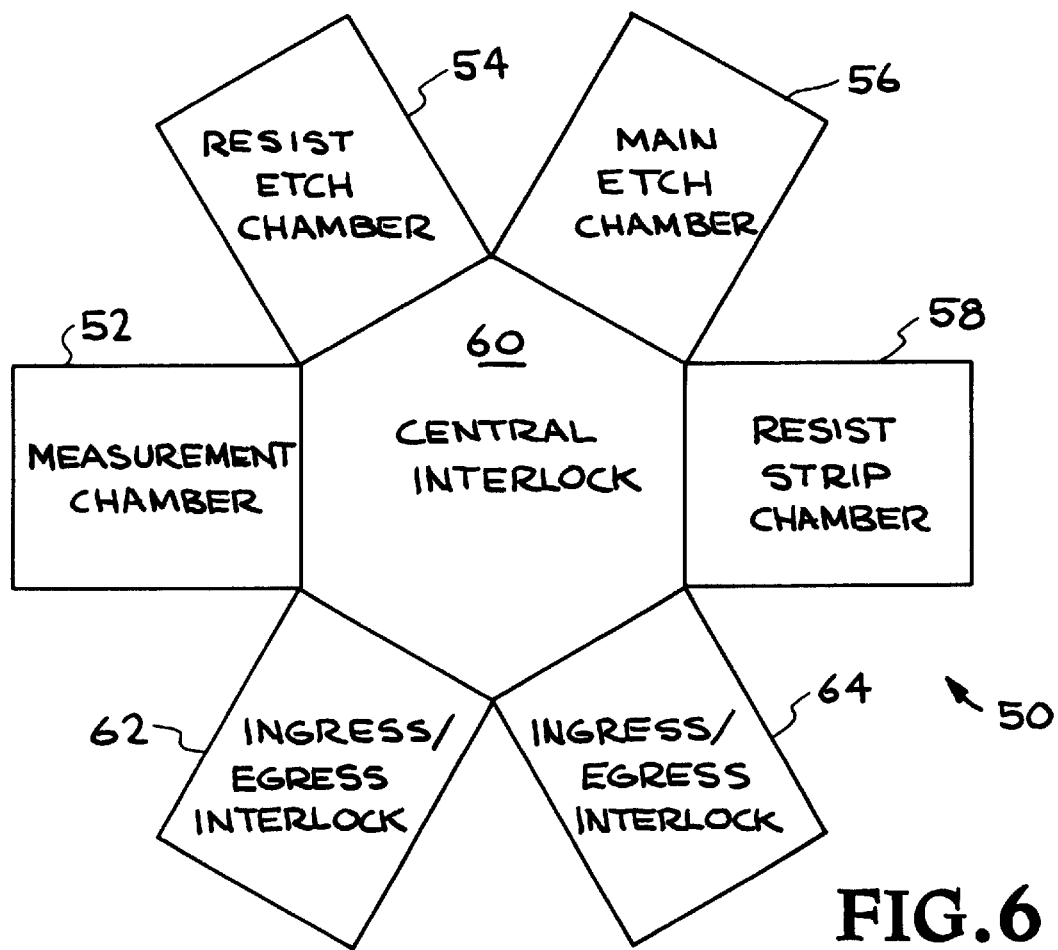
FIG. 6 is a plan view of a multichamber vacuum apparatus which may be used in the practice of the process of the invention.

As shown in FIG. 6, all of the measuring and dry etching steps may be carried out in the same vacuum apparatus, although not necessarily in the same chamber. A multichamber vacuum apparatus is generally indicated by arrow 50 comprising a measurement vacuum chamber 52 for measuring the resist mask, e.g., the width of the lines, a resist mask etch vacuum chamber 54 used to adjust (reduce) the critical dimension (CD) of the mask (usually the linewidth), a third vacuum chamber 56 used to perform the main etching of the patternable layer through the photoresist etch mask, and a fourth vacuum chamber 58 used for subsequent removal (stripping) of the resist mask. Multichamber vacuum apparatus 50 is further provided with a central interlock region 60 (also maintained under vacuum) through which the substrates are moved from one vacuum chamber to another without exposing the substrates to the atmosphere. Interlock chambers 62 and 64 are provided with ports (not shown) at each end and are used to provide ingress and egress for the substrates to vacuum apparatus 50.

Thus, the invention provides a process wherein a layer of patternable material may be more accurately etched through a resist mask to form a desired pattern by first forming the resist mask with oversized lateral dimensions followed by the step of dry etching of the resist mask to reduce the oversized lateral dimensions of the resist mask followed by measurement of the resist mask, preferably in the same vacuum chamber, to ascertain whether or not the desired final lateral dimensions of the resist mask have been attained by the dry etching step. If the desired final lateral dimensions of the resist mask have not been reached the dry etching and measurement steps are repeated until the desired lateral dimensions of the resist mask have been reached. Then the resist mask is conventionally used as an etch mask to pattern the underlying patternable layer, resulting in an accurately patterned layer of material having the desired lateral dimensions therein, to thereby reduce or eliminate the discarding of substrates having patterned layers thereon outside of the desired specifications for lateral dimensions.

Having thus described the invention what is claimed is:

1. A process for forming a photoresist mask over a layer of patternable material of an integrated circuit structure formed on a semiconductor substrate which comprises:

a) forming a photoresist mask with oversized lateral dimensions over said layer of patternable material;

b) then dry etching said oversized resist mask to reduce the lateral dimensions of said resist mask;

c) then measuring said dry etched resist mask to determine the lateral dimensions of said resist mask after said step of dry etching; and d) repeating said dry etching and measurement steps b) and c), if necessary, until said lateral dimensions of said resist mask reach the desired size.

2. The process of claim 1 which further includes the step of measuring the lateral dimensions of said oversized resist mask prior to the dry etching step to determine the initial lateral dimensions of said resist mask.

3. A process for forming a photoresist mask having lateral dimensions of a desired size over a layer of patternable material of an integrated circuit structure formed on a semiconductor substrate which comprises:

a) forming a photoresist mask with lateral dimensions larger than said desired size over said layer of patternable material;

b) then dry etching said oversized resist mask in a vacuum apparatus to reduce the lateral dimensions of said resist mask;

c) then measuring said dry etched resist mask in a vacuum apparatus to determine the lateral dimensions of said resist mask after said step of dry etching; and d) repeating said dry etching and measurement steps b) and c), if necessary, until said lateral dimensions of said resist mask reach said desired size.

4. The process of claim 3 wherein said dry etching step and said step of measuring said dry etched resist mask are carried out in separate chambers of the same vacuum apparatus.

5. The process of claim 3 wherein said dry etching step and said step of measuring said dry etched resist mask are carried out in the same chamber of the same vacuum apparatus.

6. The process of claim 3 which further includes the step of initially measuring the lateral dimensions of said oversized resist mask prior to said dry etching step to determine the initial lateral dimensions of said resist mask.

7. The process of claim 6 wherein said step of initially measuring the lateral dimensions of said oversized resist mask and said dry etching step are both carried out in the same vacuum apparatus.

8. A process for forming a photoresist mask over a layer of patternable material of an integrated circuit structure formed on a semiconductor substrate which comprises:

a) forming a photoresist mask with oversized lateral dimensions over said layer of patternable material;

b) then dry etching said oversized resist mask in a vacuum apparatus to reduce the lateral dimensions of said resist mask;

c) then measuring said dry etched resist mask in a vacuum apparatus to determine the lateral dimensions of said resist mask after said step of dry etching;

d) repeating said dry etching and measurement steps c) and d), if necessary, until said lateral dimensions of said resist mask reach the desired size;

e) etching said layer of patternable material through said resist mask;

f) removing said resist mask form said substrate; and g) measuring the dimensions of the resulting etch layer of patterned material.

9. The process of claim 8 wherein said dry etching step and said step of measuring said dry etched resist mask are carried out in separate chambers of the same vacuum apparatus.

10. The process of claim 8 wherein said dry etching step and said step of measuring said dry etched resist mask are carried out in the same chamber of the same vacuum apparatus.

11. The process of claim 8 which further includes the step of initially measuring the lateral dimensions of said oversized resist mask prior to said dry etching step to determine the initial lateral dimensions of said resist mask.

12. The process of claim 11 wherein said step of initially measuring the lateral dimensions of said oversized resist mask and said dry etching step are both carried out in the same vacuum apparatus.

13. The process of claim 11 wherein said step of initially measuring the lateral dimensions of said oversized resist mask, said dry etching step, and said step of measuring said dry etched resist mask are all carried out in the same vacuum apparatus.

* * * * *